(12) United States Patent
Sohn

(10) Patent No.: US 7,026,256 B2
(45) Date of Patent: Apr. 11, 2006

(54) METHOD FOR FORMING FLOWABLE DIELECTRIC LAYER IN SEMICONDUCTOR DEVICE

(75) Inventor: Yong-Sun Sohn, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 130 days.

(21) Appl. No.: 10/746,069

(22) Filed: Dec. 24, 2003

(65) Prior Publication Data

US 2005/0020063 A1 Jan. 27, 2005

(30) Foreign Application Priority Data

Jul. 24, 2003 (KR) ...................... 10-2003-0051128

(51) Int. Cl.
*H01L 21/469* (2006.01)

(52) U.S. Cl. ........................ 438/781; 438/797; 257/634

(58) Field of Classification Search ................ 257/621, 257/634, 641–644; 438/471–474, 632, 646, 438/660–663, 672, 675, 677, 760, 698, 781, 438/797
See application file for complete search history.

(56) References Cited

U.S. PATENT DOCUMENTS

| 6,703,321 B1 * | 3/2004 | Geiger et al. ................ 438/760 |
| 2005/0020093 A1 * | 1/2005 | Ahn et al. ................... 438/782 |

FOREIGN PATENT DOCUMENTS

KR 1020030059445 7/2003

* cited by examiner

*Primary Examiner*—David Nelms
*Assistant Examiner*—Calvin Lee
(74) *Attorney, Agent, or Firm*—Blakely Sokoloff Taylor & Zafman

(57) ABSTRACT

The method for forming a flowable dielectric layer without micro-voids therein in a semiconductor device is employed to utilize a ultra-violet (UV) bake process. The method includes steps of: forming a plurality of patterns on a semiconductor substrate, wherein narrow and deep gaps are formed therebetween; forming a flowable dielectric layer so as to fill the gaps between the patterns; carrying out a baking process for densifying the flowable dielectric layer from a bottom face thereof; forming a plurality of contact holes by selectively etching the flowable dielectric layer; carrying out a pre-cleaning process in order to remove native oxide and impurity substances on the contact holes; and forming a plurality of contact plugs by filling a conductive material into the contact holes.

9 Claims, 5 Drawing Sheets

METHOD FOR FORMING FLOWABLE DIELECTRIC LAYER IN SEMICONDUCTOR DEVICE

FIELD OF THE INVENTION

The present invention relates to a method for manufacturing a semiconductor device; and, more particularly, to a method for forming a flowable dielectric layer without micro-pores therein in a semiconductor device by using a ultra-violet (UV) bake process.

DESCRIPTION OF THE PRIOR ART

In recent years, as a semiconductor technology advances, circuit elements and interconnections on a wafer or a semiconductor substrate become increasingly denser and denser. In order to prevent unwanted interactions between these circuit elements, insulator-filled gaps or trenches located therebetween are provided to physically and electrically isolate the elements and conductive lines. However, as circuit densities continue to increase, the widths of these gaps decrease, thereby increasing gap aspect ratios which are typically defined as the gap height divided by the gap width. As a result, it is very difficult to fill these narrow and deep gaps with a predetermined gap-fill material, which can lead to unwanted voids and discontinuities in an insulating layer. Therefore, in attempt to address this problem, there have been proposed techniques for forming the insulating layer by using a material such as a borophosphosilicate glass (BPSG), a high density plasma (HDP) oxide or the like, for improving a gap-fill property of the insulating layer.

In general, in case of employing the BPSG as an insulating material, it shows a good gap-fill property but still a drawback that there may be happened the diffusion phenomenon of the dopant in a transistor during a high thermal process, i.e., a reflow process.

Meanwhile, an HDP process is recently used to fill high aspect ratio gaps. Typical HDP process employs a chemical vapor deposition (CVD) with a gas mixture containing oxygen, silane, and inert gases such as argon, to achieve a simultaneous dielectric etching and deposition. In the HDP process, an RF bias is applied to a wafer substrate in a reaction chamber. Some of these gas molecules, i.e., particularly argon, are ionized in the plasma and accelerate toward the wafer surface when the RF bias is applied to the wafer. Material is thereby sputtered when ions strike the surface. As a result, an insulating material deposited on the wafer surface is simultaneously sputter etched to help to keep the gaps open during the deposition process, which allows higher aspect ratio gaps to be filled. Although the HDP process has the aforementioned advantage for filling the high aspect ratio gaps, it suffers from shortcomings that there may be happened etch damages of an underlying layer due to a plasma and further, edges of a micro-pattern are eroded while repeating the deposition and the sputter etch during the HDP process.

In attempt to overcome the above problems, therefore, there is proposed another technique utilizing flowable dielectrics for filling the narrow and the deep gaps, i.e., the high aspect ratio gaps, and for protecting the underlying layer from the damage in fabricating the semiconductor device.

Referring to FIGS. 1A to 1D, there are shown cross sectional views setting forth a conventional method for forming a flowable dielectric layer 120 in a semiconductor device.

In FIG. 1A, a semiconductor substrate 110 where an active area 112 and a field area 114 are defined, is prepared in advance by a predetermined process. Thereafter, a plurality of gates 116 with narrow widths are formed on predetermined locations of a top face of the semiconductor substrate 110. Afterward, a predetermined insulating layer (not shown) is formed over the resultant structure and is anisotropically etched into a first predetermined configuration, thereby forming sidewall spacers 118 on the gates 116. Subsequently, a flowable dielectric layer 120 is formed over the resultant structure embracing the gates 116 and the sidewall spacers 118.

In an ensuing step, referring to FIG. 1B, an annealing process is carried out in a furnace or a rapid thermal process (RTP) for cross-linking Si—O, Si—O—H or Si—C—H bondings, for substituting Si—O bondings for Si—H or Si—O—H bondings in the flowable dielectric layer 120, to thereby result in the out-gassing of hydrogen, moisture, $CH_4$, $NH_3$ or the like, and densify the flowable dielectric layer 120. The gases produced during the dehydration reaction is removed during the annealing process so that there are formed a plurality of micro-pores 115 in the flowable dielectric layer 120. In detail, a top face of the flowable dielectric layer 120 is shrunk to condense the flowable dielectric layer 120 during the annealing process so that the micro-pores 115 are rarely formed in a top region thereof. However, since a bottom face of the flowable dielectric layer 120 is fixed to a wafer surface, a bottom region of the flowable dielectric layer 120 is hardly shrunk during the densification, whereby the micro-pores 115 are inevitably formed after carrying out the annealing process.

After carrying out the annealing process, the flowable dielectric layer 120 is planarized till top faces of the gates 116 are exposed by using a method such as a chemical mechanical polishing (CMP).

In a next step, referring to FIG. 1C, contact masks (not shown) are formed on predetermined locations of the top face of the flowable dielectric layer 120. Afterward, the flowable dielectric layer 120 is patterned into a second predetermined configuration by using the contact masks as etch masks, thereby forming a plurality of contact holes 101 and patterned flowable dielectrics 120A. In FIG. 1C, it is understood that the micro-pores 115 still remain in the patterned flowable dielectrics 120A.

In a subsequent step, a pre-cleaning process is carried out for removing a natural oxide (not shown) formed after the formation of the contact holes 101, thereby securing a bottom area of the contact holes 101. While the pre-cleaning process is performed, the micro-pores 115 are enlarged gradually. That is, the micro-pores 115 formed on the sidewalls of the patterned flowable dielectrics 120A are eroded gradually by a solution for use in the pre-cleaning process. As a result, enlarged micro-pores 115A are formed on the sidewalls of the patterned flowable dielectrics 120A, as shown in FIG. 1C.

Following the pre-cleaning process, referring to FIG. 1D, a polysilicon layer is formed over the resultant structure so that the contact holes 101 are filled with the polysilicon and then, is planarized by using a method such as the CMP or an etchback process, thereby forming contact plugs 121 and 122, wherein one contact plug 121 is disposed between the gates 116 and the other contact plugs 122 are disposed aside the patterned flowable dielectrics 120A. Since the micro-pores 115A became enlarged during the pre-cleaning process, the polysilicon encroaches into the enlarged micro-pores 115A formed on the sidewalls of the patterned flowable dielectrics 120A, thereby forming rugged sidewall surfaces 126 of the conductive plugs 122 which are disposed aside the patterned flowable dielectrics 120A.

Referring to FIGS. 2A and 2B, there are shown micrographs of a scanning electron micrography (SEM) depicting the micro-pores 115 existing in the patterned flowable dielectrics 120A and the conductive plugs 122 having the rugged sidewall surfaces 126.

In FIG. 2A, it is understood that the micro-pores 115 are formed in the patterned flowable dielectric layer 120A except the top regions of the patterned flowable dielectrics 120A, after carrying out the annealing process. That is, since the bottom regions of the patterned flowable dielectrics 120A are fixed to the wafer surface and are hardly shrunk during the annealing process, there are inevitably formed micro-pores 115 in the bottom regions of the flowable dielectric layer 120.

FIG. 2B shows the micrograph that the polysilicon encroaches into the enlarged micro-pores 115A after carrying out the pre-cleaning process and the process for forming the polysilicon layer. As aforementioned, the micro-pores 115A formed during the annealing process are enlarged during the pre-cleaning process. Therefore, the conductive plugs 122 disposed aside the patterned flowable dielectrics 120A have the rugged sidewall surface 126 encroaching into the patterned flowable dielectrics 120A so that there may be generated a leakage current between adjacent contact plugs, i.e., the bridge phenomenon. Furthermore, as a modern semiconductor device is much more miniaturized, the polysilicon encroaching into the enlarged micro-pores 115A of the patterned flowable dielectrics 120A becomes a serious problem because the modern semiconductor demands dense and miniaturized patterns. Thus, it is difficult to apply the conventional aforementioned process for forming the flowable dielectric layer to the miniaturized semiconductor device having the patterns of the high aspect ratio.

SUMMARY OF THE INVENTION

It is, therefore, an object of the present invention to provide a method for forming a flowable dielectric layer in a semiconductor device by employing a ultra-violet (UV) bake process, thereby densifying the flowable dielectric layer uniformly from a bottom face thereof without micro-pores therein.

In accordance with one aspect of the present invention, there is provided a method for forming a flowable dielectric layer in a semiconductor device, the method including the steps of: a) forming a plurality of patterns on a semiconductor substrate, wherein narrow and deep gaps are formed therebetween; b) forming a flowable dielectric layer so as to fill the gaps between the patterns; c) carrying out a baking process for densifying the flowable dielectric layer from a bottom face thereof; d) forming a plurality of contact holes by selectively etching the flowable dielectric layer; e) carrying out a pre-cleaning process in order to remove native oxide and other impurity substances like etch byproducts on the contact holes; and f) forming a plurality of contact plugs by filling a conductive material into the contact holes.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 3A to 3D cross sectional views setting forth a method for forming a flowable dielectric layer in a semiconductor device in accordance with a preferred embodiment of the present invention.

Figure 1A:
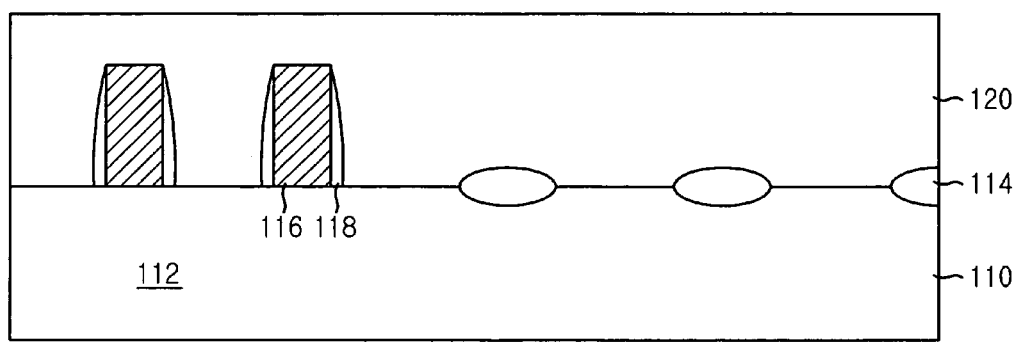
FIGS. 1A to 1D are cross sectional views setting forth a conventional method for forming a flowable dielectric layer in a semiconductor device.
Figure 1B:
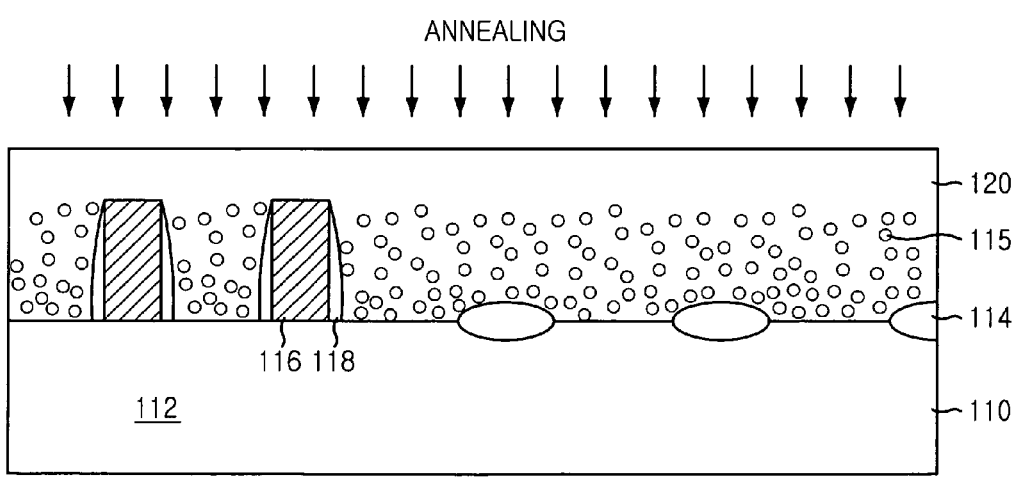
Figure 1C:
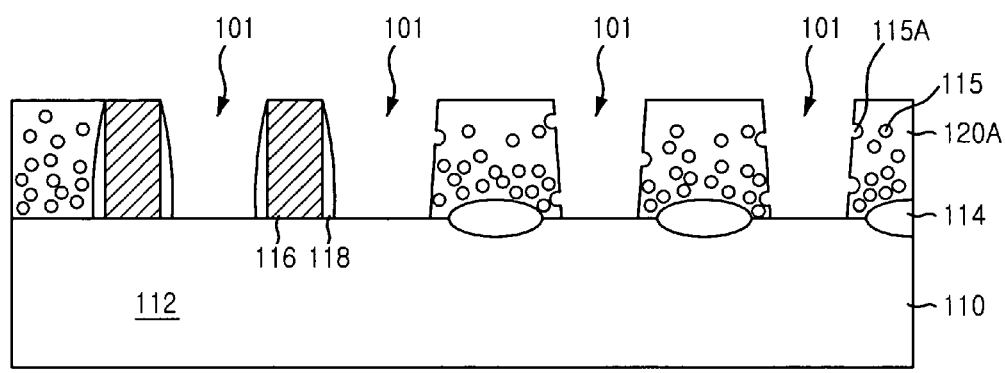
Figure 1D:
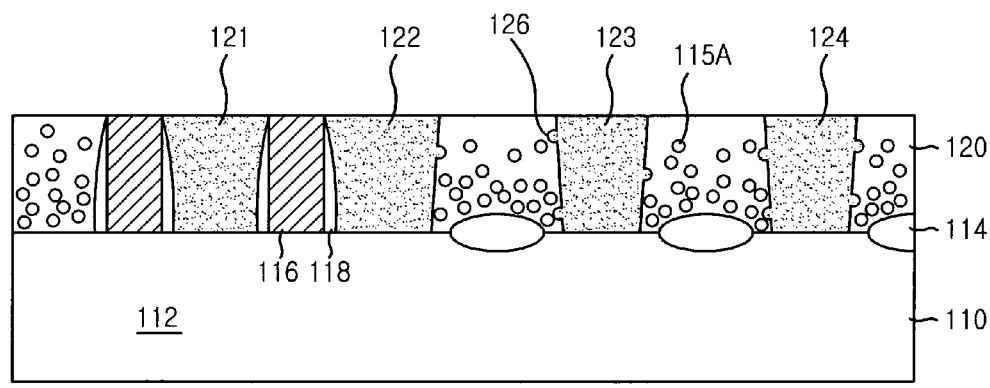
Figure 2A:
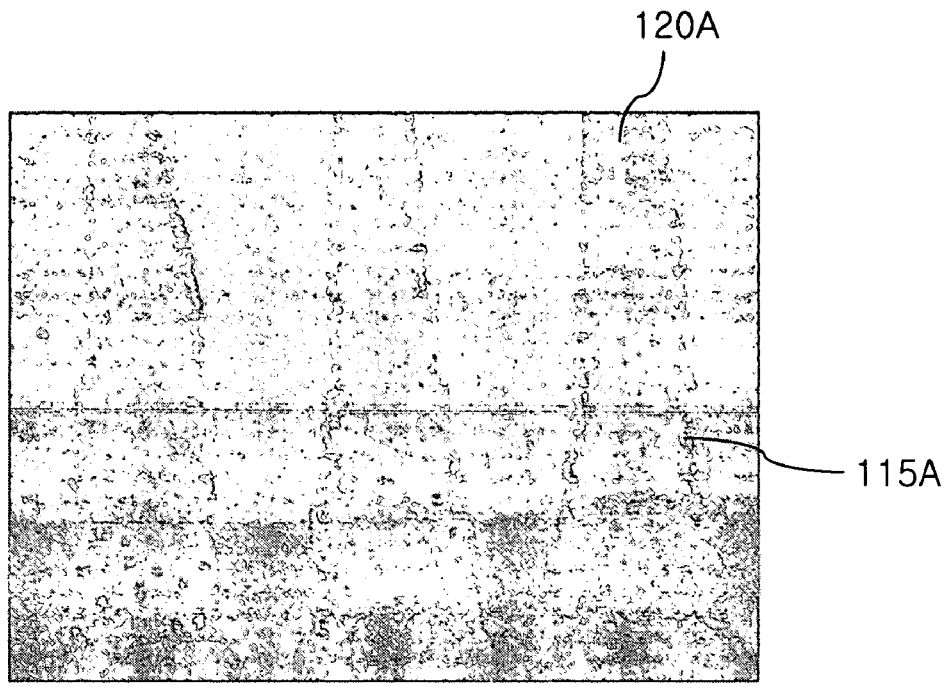
FIGS. 2A and 2B are micrographs of a scanning electron micrography (SEM) depicting the micro-pores existing in the flowable dielectric layer and the conductive plugs encroaching into the micro-pores of the flowable dielectric layer according to the conventional method.
Figure 2B:
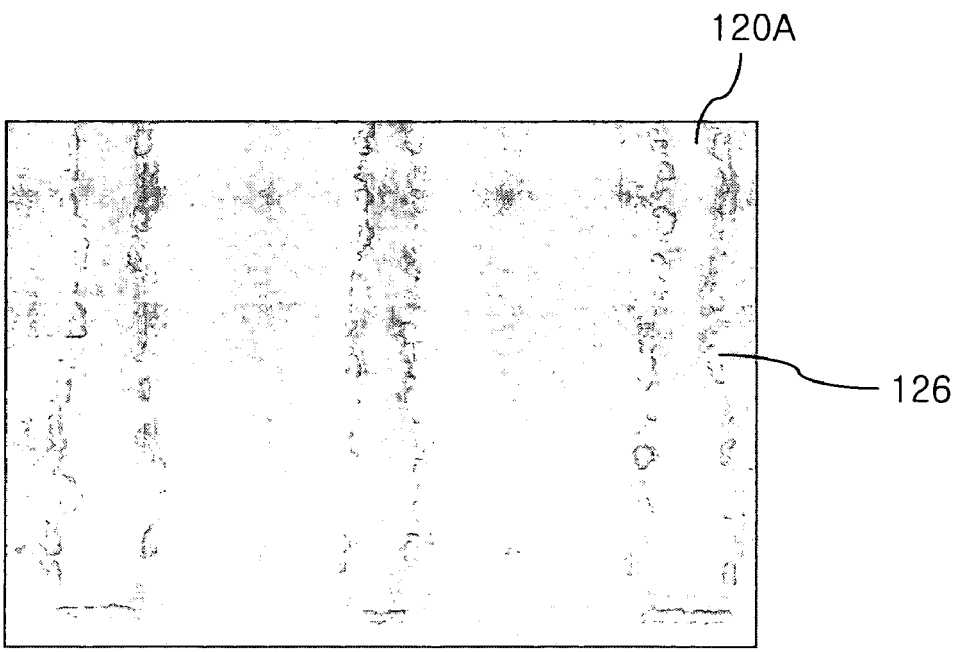
Figure 3A:
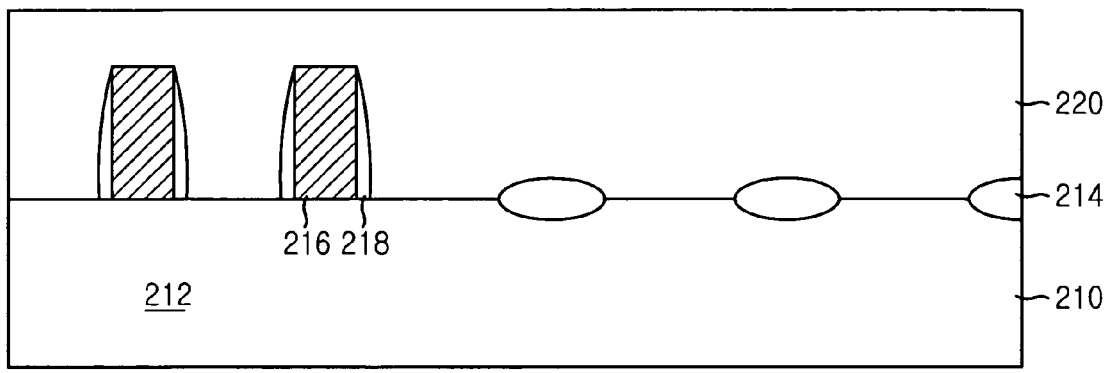
FIGS. 3A to 3D are cross sectional views setting forth a method for forming a flowable dielectric layer in a semiconductor device in accordance with a preferred embodiment of the present invention.

In FIG. 3A, an inventive method begins with preparing a semiconductor substrate 210 where field oxide (FOX) areas 214 and an active area 212 are defined in preset locations of the semiconductor substrate 210 by a predetermined process. Thereafter, gates 216 are formed on predetermined locations of a top face of the semiconductor substrate 210, wherein there is formed a gap between adjacent gates 216 having a narrow space. Afterward, sidewall spacers 218 are formed on sidewalls of the gates 216 by using a typical etching process in which the sidewall spacers 218 uses a silicon nitride. As is well known, there are typically formed gate oxides (not shown) beneath the gates 216 and the gates 216 may be a stack structure of a polysilicon layer, a metal layer and a hard mask. For example, the metal layer and the hard mask use tungsten and nitride, respectively.

In a next step, a flowable dielectric layer 220 is formed over the resultant structure by using a spin on dielectric (SOD) such as a silicate, a siloxane, a methyl SilsesQuioxane (MSQ), a hydrogen SisesQuioxane(HSQ), an MSQ/HSQ, a perhydrosilazane (TCPS) or a polysilazane. Alternatively, the flowable dielectric layer 220 can be formed by using a low temperature undoped dielectric at a temperature in a range of about −10° C. to about 150° C. under a pressure ranging from about 10 mTorr to about 100 mTorr, wherein a reaction source uses a mixture gas of $SiH_x(CH_3)_y$, ($1 \leq x \leq 4$, $1 \leq y \leq 4$), $H_2O_2$, $O_2$, $H_2O$ and $N_2O$. It is preferable that the thickness of the flowable dielectric layer 220 is in the range of about 200 Å to about 5,000 Å in consideration of heights of the gates 216 and a gap space between the gates 216.

Figure 3B:
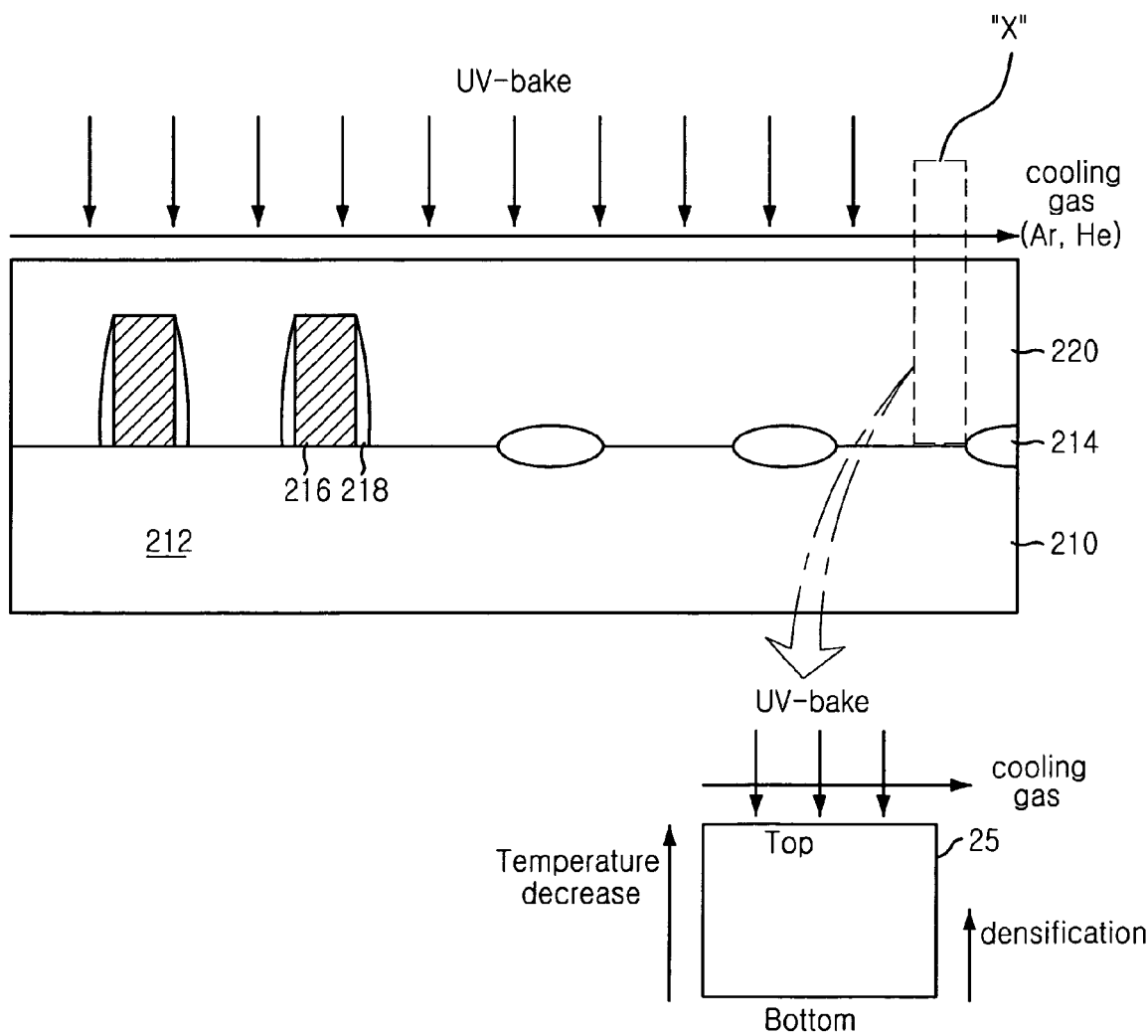
Figure 3C:
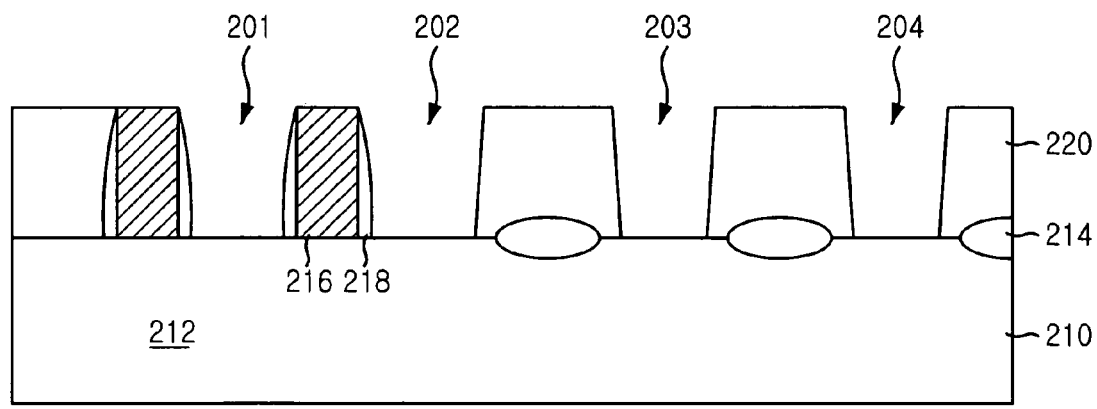
Figure 3D:
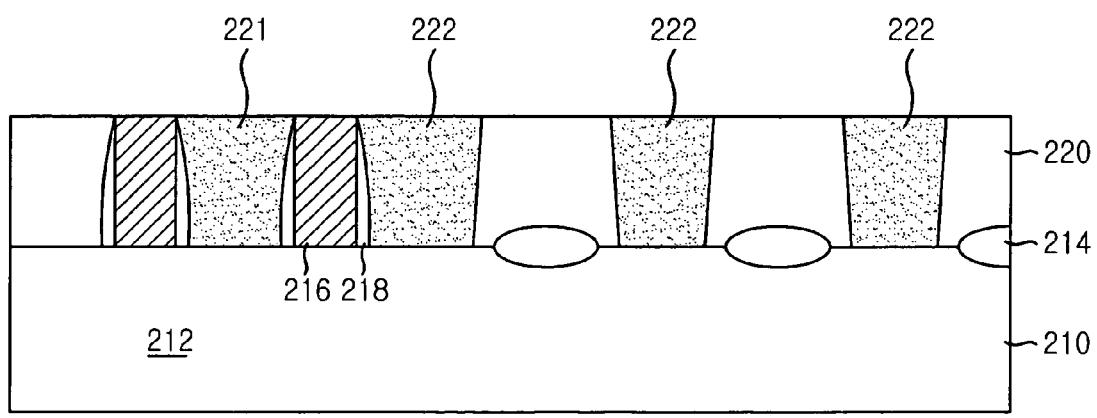

After forming the flowable dielectric layer 220, referring to FIG. 3B, a ultra-violet (UV) bake process is carried out for densifying the flowable dielectric layer 220 from the bottom face thereof and removing moisture therein. That is, a UV light penetrates through the flowable dielectric layer 220 and is irradiated to the surface of the semiconductor substrate 210 so that a temperature of a top region of the flowable dielectric layer 220 is relatively lower that that of a bottom region of the flowable dielectric layer 220. Therefore, a densification of the flowable dielectric layer 220 is achieved from the bottom face thereof. Since the densification of the flowable dielectric layer 220 progresses from the bottom face thereof, the top region of the flowable dielectric layer 220 becomes shrunk gradually so that there is rarely formed micro-pore in the flowable dielectric layer 220. Herein, it is preferable that the UV bake process is carried out at the temperature in the range of about 300° C. to about 800° C., inducing a temperature gradient between a top region of the flowable dielectric layer 220 and a bottom region thereof.

Furthermore, in case of supplying a cooling gas, e.g., an argon gas or a helium gas with a higher pressure than UV Bake Chamber, into a low pressure ambient or a vacuum state ambient chamber, the temperature gradient may increase more than the case of not supplying the cooling gas. That is, when the cooling gas with the higher pressure than UV Bake Chamber flows into the low pressure ambient or the vacuum state ambient chamber, i.e., preferably in the range of about 1 mTorr to about 100 Torr, the surface of the flowable dielectric layer 220 becomes cooled so that the top face of the flowable dielectric layer 220 is rarely densified. If the cooling gas is supplied to the top face of the flowable dielectric layer 220, the densification progresses more slowly from the bottom face thereof so that the flowable dielectric layer 220 is delicately densified from the bottom face thereof.

Referring to the detailed drawing of a denoted region "X" in FIG. 3B, when the cooling gas, e.g., argon or helium gas, flows along the top face of the flowable dielectric layer 220, the flowable dielectric layer 220 has a low temperature in the top region and a high temperature in the bottom region. If the UV bake process is carried out while supplying the cooling gas with the atmosphere pressure, the flowable dielectric layer 220 is densified slowly from the bottom region thereof, as aforementioned already. By employing the UV bake process in the present invention, it is possible to remove or minimize micro-pores which are typically formed in the prior art thermal process.

In the above description, the only UV bake process is carried out for the densification and out-gassing. Alternatively, a supplementary thermal process after carrying out the UV bake process can be employed to densify the flowable dielectric layer 220 from the top face. Herein, it is preferable that the supplementary thermal process is carried out in a furnace at the temperature ranging from about 300° C. to about 800° C.

After densifying the flowable dielectric layer 220, the flowable dielectric layer 220 is planarized till the top faces of the gates 216 are exposed by using the CMP process. The reason of carrying out the planarization process before forming contact holes 201 is to secure a wider area in a bottom region of the contact holes 201 because an etch profile is slightly inclined toward the bottom faces of the contact holes 201.

Subsequently, preset contact masks (not shown) are formed on predetermined locations of the top face of the planarized flowable dielectric layer 220. Afterward, the planarized flowable dielectric layer 220 is patterned into a predetermined configuration by using the preset contact masks so as to form the contact holes 201 and patterned flowable dielectrics 220A.

Following the formation of the contact holes 201, a pre-cleaning process is carried out for removing a native oxide and defects formed on the semiconductor substrate 210 by using a method such as a wet cleaning or a dry cleaning process. In the present invention, since there is rarely formed the micro-pore in the flowable dielectric layer 220, the phenomenon that micro-pore becomes enlarged during the pre-cleaning process can not happened.

After carrying out the pre-cleaning process, a conductive layer is deposited over the resultant structure and is planarized by using the CMP process, thereby forming the contact plugs 221 and 222. Among the contact plugs 221 and 222, as a examples of DRAM case, one of the contact plugs 222 serves as a storage node contact plug and the other contact plug 221 serves as a bit line contact. Herein, the conductive layer uses a material such as a polysilicon, amorphous silicon, a dopant-implanted polysilicon or a dopant-implanted amorphous silicon or a doped epi-silicon.

As described above, in comparison with the prior art method, the UV bake process is employed in the present invention, in order to densify the flowable dielectric layer 220 from the bottom face and to remove the moisture therein while supplying the cooling gas with the high pressure than UV chamber into the low pressure ambient or the vacuum state ambient chamber. Therefore, the flowable dielectric layer 220 becomes densified uniformly from the bottom face thereof so that it is possible to avoid micro-voids therein because the top region of the flowable dielectric layer 220 is gradually shrunk during the densification of the bottom region. As a result, it is possible to remove or minimize the micro-pores so that the contact plugs 222 do not have a rugged surface. Accordingly, it is possible to prevent a bridge phenomenon between adjacent contact plugs, which is mainly generated by the polysilicon encroaching into the micro-pores existing in the flowable dielectric layer 220 in the prior art method.

Furthermore, the UV bake process is carried out at a low temperature, to thereby prevent the dopant diffusion and a deterioration of the device characteristic.

In addition, since the flowable dielectric layer 220 can be densified uniformly from the bottom face thereof without the micro-pores by employing the UV process, it is possible to secure a cleaning process margin, to thereby enhance a contact resistance and remove defects existing in a wafer produced during the etch process.

While the present invention has been described with respect to the particular embodiments, it will be apparent to those skilled in the art that various changes and modifications may be made without departing from the scope of the invention as defined in the following claims.

What is claimed is:

1. A method for forming a flowable dielectric layer in a semiconductor device, the method comprising the steps of:
    a) forming a plurality of patterns on a semiconductor substrate, wherein narrow and deep gaps are formed therebetween;
    b) forming a flowable dielectric layer so as to fill the gaps between the patterns;
    c) carrying out a ultra-violet (UV) baking process for densifying the flowable dielectric layer from a bottom face thereof, wherein the UV bake process is carried out while supplying a cooling gas over the flowable dielectric layer;
    d) forming a plurality of contact holes by selectively etching the flowable dielectric layer;
    e) carrying out a pre-cleaning process in order to remove native oxide and impurity substances on the contact holes; and
    f forming a plurality of contact plugs by filling a conductive material into the contact holes.

2. The method as recited in claim 1, wherein the cooling gas uses an inert gas such as argon gas, helium gas or the like.

3. The method as recited in claim 1, wherein the UV bake process is carried out under a pressure in a range of about 1 mTorr to about 100 Torr by supplying the inert gas.

4. The method as recited in claim 1, wherein the UV bake process is carried out at a temperature in the range of about 300° C. to about 800° C.

5. The method as recited in claim 1, after the step c), further comprising the step of carrying out a thermal process for densifying the flowable dielectric layer from a top face thereof.

6. The method as recited in claim 5, wherein the step of carrying out the thermal process after the step c) is performed at the temperature ranging from about 300° C. to about 800° C.

7. The method as recited in claim 1, wherein the step b) is carried out by means of a spin on dielectric (SOD) technique by using a material selected from the group consisting of a silicate, a siloxane, a methyl SilsesQuioxane (MSQ), a hydrogen SisesQuioxane(HSQ), a MSQ/HSQ, a perhydrosilazane (TCPS) and polysilazane.

8. The method as recited in claim 1, wherein the step b) is carried out by using a low temperature dielectrics at a temperature in a range of about −10° C. to about 150° C. under a pressure ranging from about 10 mTorr to about 100 Torr, wherein a reaction source uses a mixture gas of $SiH_x(CH_3)_Y$ ($1x \leqq 4$, $1 \leqq y \leqq 4$), $H_2O_2$, $O_2$, $H_2O$ and $N_2O$.

9. The method as recited in claim 1, wherein the step b) is carried out by using a low temperature dielectrics at a temperature in a range of about −10° C. to about 150° C. under a pressure ranging from about 10 mTorr to about 100 Torr, wherein a reaction source uses a mixture gas of $SiH_4$, $H_2O_2$, $O_2$, $H_2O$ and $N_2O$.

* * * * *